United States Patent
Sakurai et al.

(12)

(10) Patent No.: US 6,517,688 B2
(45) Date of Patent: Feb. 11, 2003

(54) METHOD OF SMOOTHING DIAMOND COATING, AND METHOD OF MANUFACTURING DIAMOND-COATED BODY

(75) Inventors: Masatoshi Sakurai, Toyokawa (JP); Hiroaki Sugita, Toyokawa (JP)

(73) Assignee: OSG Corporation, Toyokawa (JP)

( * ) Notice: Subject to any disclaimer, the term of this patent is extended or adjusted under 35 U.S.C. 154(b) by 0 days.

(21) Appl. No.: 09/927,337

(22) Filed: Aug. 13, 2001

(65) Prior Publication Data

US 2002/0040848 A1 Apr. 11, 2002

(30) Foreign Application Priority Data

Oct. 11, 2000 (JP) .......................... 2000-310259
Jun. 28, 2001 (JP) .......................... 2001-196701

(51) Int. Cl.$^7$ ........................... C23C 14/00; C23C 14/32
(52) U.S. Cl. ............... 204/192.35; 204/192.32; 204/192.38; 427/523; 427/524; 427/531; 427/534; 427/540; 427/331
(58) Field of Search ................... 427/523, 524, 427/531, 534, 540, 331; 204/192.32, 192.35, 192.38

(56) References Cited

FOREIGN PATENT DOCUMENTS

JP B2 2519037 5/1996

OTHER PUBLICATIONS

D. G. Bhat et al., "A preliminary investigation of the effect of post-deposition polishing of diamond films on the machining behavior of diamond-coated cutting tools", *Diamond and Related Materials*, vol. 4, 1995, pp. 921–929.

*Primary Examiner*—Rodney G. McDonald
(74) *Attorney, Agent, or Firm*—Oliff & Berridge, PLC

(57) ABSTRACT

A method of smoothing a surface of a diamond coating of a diamond-coated body, by using an arc-type ion plating device in which at least one target is disposed. The method includes: (a) a step of causing arc discharge between an anode, and a cathode which is provided by each of the above-described at least one target, whereby positive ions are emitted from the above-described at least one target; and (b) a step of applying a negative bias voltage to the diamond-coated body which is disposed in the arc-type ion plating device, whereby the surface of the diamond coating is bombarded with the positive Lions, so as to be smoothed by the bombardment of the positive ions against the surface of the diamond coating.

19 Claims, 5 Drawing Sheets

FIG. 4

| SAMPLE No. | SMOOTHING TREATMENT | SURFACE ROUGHNESS (μm) OF DIAMOND COATING | | |
| --- | --- | --- | --- | --- |
| | | PERIPHERAL FLANK FACE | END FLANK FACE | RAKE FACE |
| 1 | NO | 3.3 | 3.8 | 1.8 |
| 2 | Ti BOMBARDMENT | 1.6 | 1.8 | 1.8 |
| 3 | TiAl BOMBARDMENT | 2.0 | 2.7 | 1.8 |
| 4 | Cr BOMBARDMENT | 1.9 | 2.4 | 1.5 |

BEFORE SMOOTHING TREATMENT  AFTER SMOOTHING TREATMENT
CUTTING EDGE (×350)

BEFORE SMOOTHING TREATMENT  AFTER SMOOTHING TREATMENT
CUTTING EDGE (×1000)

BEFORE SMOOTHING TREATMENT  AFTER SMOOTHING TREATMENT
PERIPHERAL FLANK FACE (×1000)

FIG. 6

| SAMPLE No. | SURFACE ROUGHNESS (μm) OF MACHINED WORKPIECE | |
|---|---|---|
| | Rmax | Ry |
| 1 | 5.4 | 4.0 |
| 2 | 3.0 | 3.6 |
| 3 | 3.4 | 3.6 |
| 4 | 4.2 | 3.4 |

METHOD OF SMOOTHING DIAMOND COATING, AND METHOD OF MANUFACTURING DIAMOND-COATED BODY

BACKGROUND OF THE INVENTION

1. Field of the Invention

The present invention relates in general to a method of smoothing a diamond coating, and more particularly to such a method which makes it possible to efficiently and accurately smooth a diamond-coated body having a complicated, three-dimensional geometry.

2. Discussion of the Related Art

As one type of a cutting tool such as an end mill, a tap and a drill, there is proposed a diamond-coated cutting tool in which a tool substrate made of a cemented carbide or other material is coated with a diamond coating, as disclosed in JP-B2-2519037 (publication of Japanese Patent issued in 1996) by way of example. In the diamond-coated cutting tool disclosed in this Japanese Patent publication, the tool substrate is coated with the diamond coating in accordance with a CVD (chemical vapor deposition) method. The diamond coating of the disclosed tool consists of an aggregation of grown diamond crystals, each of which has a large grain size or diameter. The large diameter of each diamond crystal causes the outer surface of the diamond coating to have large pits and projections which are inevitably transferred onto a machined surface of a workpiece which is machined by the cutting tool, thereby making it difficult to obtain a required degree of smoothness of the machined surface. In the interest of improving the smoothness of the machine surface, there are proposed methods of smoothing the surface of the diamond coating, by using various techniques such as laser beam, ion beam, thermo-mechanical lapping and mechanical-chemical lapping, as described in an article entitled "A preliminary investigation of the effect of post-deposition polishing of diamond films on the machining behavior of diamond-coated cutting tools" in pages 921–929 of "DIAMOND AND RELATED MATERIALS Vol.4 (1995)".

However, the polishing method with the laser is not adequate for efficiently polishing a drill, end mill or other body having a three-dimensional geometry, although the method with the laser generally provides a high polishing rate. The polishing method with the ion beam requires a time as long as tens of hours for polishing a body, due to its low polishing rate. The polishing method with the thermo-mechanical or mechanical-chemical lapping cannot serve for polishing a body having a complicated, three-dimensional geometry with pits and projections on its surface.

SUMMARY OF THE INVENTION

It is therefore an object of the present invention to provide a method which makes it possible to smooth a surface of a diamond coating of a diamond-coated body with high efficiency and precision even where the diamond-coated body has a complicated three-dimensional geometry. This object may be achieved according to any one of first through nineteenth aspects of this invention which are described below.

The first aspect of the invention provides a method of smoothing a surface of a diamond coating of a diamond-coated body, by using an arc-type ion plating device in which at least one target is disposed, the method comprising: a step of causing arc discharge between an anode, and a cathode which is provided by each of the above-described at least one target, whereby positive ions are emitted from the above-described at least one target; and a step of applying a negative bias voltage to the diamond-coated body which is disposed in the arc-type ion plating device, whereby the surface of the diamond coating is bombarded with the positive ions, so as to be smoothed by the bombardment of the positive ions against the surface of the diamond coating.

According to the second aspect of the invention, in the method defined in the first aspect of the invention, each of the above-described at least one target includes, as a main component thereof, an element which belongs to one of groups IIIa through IVb of the periodic table.

According to the third aspect of the invention, in the method defined in the second aspect of the invention, each of the above-described at least one target includes at least one of Ti, TiAl, SiC, V, Y, Al and Cr.

According to the fourth aspect of the invention, in the method defined in any one of the first through third aspects of the invention, the negative bias voltage has a value of 500–1500 V.

The fifth aspect of the invention provides a method of smoothing a surface of a diamond coating of a diamond-coated body, by using an arc-type ion plating device in which at least one metallic target is disposed, the method comprising: a step of causing arc discharge between an anode, and a cathode which is provided by each of the above-described at least one metallic target, whereby metallic ions are emitted from the above-described at least one metallic target; and a step of applying a negative bias voltage to the diamond-coated body which is disposed in the arc-type ion plating device, whereby the surface of the diamond coating is bombarded with the metallic ions, so as to be smoothed by the bombardment of the metallic ions against the surface of the diamond coating.

According to the sixth aspect of the invention, in the method defined in the fifth aspect of the invention, each of the above-described at least one metallic target includes, as a main component thereof, a metal which belongs to one of groups IIIa through IIIb of the periodic table.

According to the seventh aspect of the invention, in the method defined in the sixth aspect of the invention, each of the above-described at least one metallic target includes at least one of Ti, TiAl, V, Y, Al and Cr.

According to the eighth aspect of the invention, in the method defined in any one of the fifth through seventh aspects of the invention, the negative bias voltage has a value of 500–1500 V.

The ninth aspect of the invention provides a method of manufacturing a diamond-coated body which includes a substrate and a diamond coating disposed on the substrate, the method comprising: a coating forming step of forming the diamond coating on the substrate; and a surface smoothing step of smoothing a surface of the diamond coating, by using an arc-type ion plating device in which at least one target is disposed, wherein the surface smoothing step including: a step of causing arc discharge between an anode, and a cathode which is provided by each of the above-described at least one target, whereby positive ions are emitted from the above-described at least one target; and a step of applying a negative bias voltage to the diamond-coated body which is disposed in the arc-type ion plating device, whereby the surface of the diamond coating is bombarded with the positive ions, so as to be smoothed by the bombardment of the positive ions against the surface of the diamond coating.

According to the tenth aspect of the invention, in the method defined in the ninth aspect of the invention, the diamond-coated body consists of a machining tool which is to be moved relative to a workpiece, for thereby machining the workpiece.

According to the eleventh aspect of the invention, in the method defined in the ninth or tenth aspect of the invention, the diamond-coated body consists of a rotary cutting tool which is to be rotated about an axis thereof-relative to a workpiece, for thereby cutting the workpiece, and which has a rake face, a flank face and a cutting edge that is defined by an intersection of the rake face and the flank face, and wherein the cutting edge is three-dimensional.

The twelfth aspect of the invention provides a method of manufacturing a diamond- coated body which includes a substrate and a diamond coating disposed on the substrate, the method comprising: a coating forming step of forming the diamond coating on the substrate; and a surface smoothing step of smoothing a surface of the diamond coating, by using an arc-type ion plating device in which at least one metallic target is disposed, wherein the surface smoothing step including: a step of causing arc discharge between an anode, and a cathode which is provided by each of the above-described at least one metallic target, whereby metallic ions are emitted from the above-described at least one metallic target; and a step of applying a negative bias voltage to the diamond-coated body which is disposed in the arc-type ion plating device, whereby the surface of the diamond coating is bombarded with the metallic ions, so as to be smoothed by the bombardment of the metallic ions against the surface of the diamond coating.

According to the thirteenth aspect of the invention, in the method defined in the twelfth aspect of the invention, each of the above-described at least one metallic target includes, as a main component thereof, a metal which belongs to one of groups IIIa through IIIb of the periodic table.

According to the fourteenth aspect of the invention, in the method defined in the thirteenth aspect of the invention, each of the above-described at least one metallic target includes at least one of Ti, TiAl, V, Y, Al and Cr.

According to the fifteenth aspect of the invention, in the method defined in any one of the twelfth through fourteenth aspects of the invention, the bias voltage has a value of 500–1500 V.

According to the sixteenth aspect of the invention, in the method defined in any one of the twelfth through fifteenth aspects of the invention, the diamond-coated body consists of a machining tool which is to be moved relative to a workpiece, for thereby machining the workpiece.

According to the seventeenth aspect of the invention, in the method defined in any one of the twelfth through sixteenth aspects of the invention, the diamond-coated body consists of a rotary cutting tool which is to be rotated about an axis thereof relative to a workpiece, for thereby cutting the workpiece, and which has a rake face, a flank face and a cutting edge that is defined by an intersection of the rake face and the flank face, and wherein the cutting edge is three-dimensional.

According to the eighteenth aspect of the invention, in the method defined in the seventeenth aspect of the invention, the rotary cutting tool has a flute which provides the rake face and which extends in a helical direction of the rotary cutting tool.

According to the nineteenth aspect of the invention, in the method defined in the eighteenth aspect of the invention, the rotary cutting tool consists of an end mill.

In the smoothing method defined in any one of the first through eighth aspects of the invention, the arc discharge is caused between the anode and the cathode that is provided by the suitable target (e.g., a metallic target), whereby the positive ions (e.g., metallic ions) are emitted from the target. Meanwhile, the negative bias voltage is applied to the diamond-coated body, whereby the surface of the diamond coating is bombarded with the positive ions at high velocity. Thus, the surface of the diamond coating is polished or smoothed by the bombardment of the positive ions to the diamond coating surface at high speed, making it possible to smooth the diamond coating surface of the diamond-coated body even where the diamond-coated body has a complicated three-dimensional geometry. In addition, it is possible to smooth the surfaces of the diamond coatings of a larger number of diamond-coated bodies in a short time owing to the use of the arc-type ion plating device, leading to an improved production efficiency of the diamond-coated body.

The manufacturing method defined in any one of the ninth through nineteenth aspects of the invention includes the surface smoothing step which is implemented in substantially the same manner as in the smoothing method defined in any one of the first through eighth aspects of the invention. Thus, the manufacturing method provides substantially the same technical advantages as the smoothing method. In addition, the manufacturing method makes it possible to efficiently manufacture the diamond-coated body having a high degree of surface smoothness. Particularly, the method defined in any one of the seventeenth through nineteenth aspects of the invention, in which the diamond-coated body consists of the rotary cutting tool, makes it possible to provide the diamond coating with a high degree of surface smoothness, while maintaining an accuracy of the complicated three-dimensional geometry of the cutting edge which does not lie on a plane, thereby enabling the rotary cutting tool to machine a workpiece with high degrees of surface smoothness and profile accuracy.

The smoothing method of the present invention is advantageously applicable in manufacturing of a diamond-coated cutting tool having a cutting tooth or teeth. However, the smoothing method is also applicable in manufacturing of any one of the other diamond-coated bodies such as a diamond-coated machining tool other than a diamond-coated cutting.tool.

The target preferably consists of the metallic target including at least one of Ti, TiAl, V, Y, Al and Cr. However, the target may consist of the non-metallic target including, for example, SiC, as long as the target makes it possible to cause the arc discharge in the arc-type ion plating device so that the surface of the diamond coating is smoothed by the arc discharge. It is noted that the above-described TiAl is interpreted to mean an alloy consisting of Ti and Al, and that the above-described SiC is interpreted to mean an alloy consisting of Si and C.

The optimum value of the negative bias voltage varies depending upon the type of the target. However, the value of the negative bias voltage is preferably 500–1500 V, more preferably 800–1200 V. If the negative bias voltage value is smaller than 500 V, the surface of the diamond coating is not bombarded with the positive ions at sufficiently high velocity, namely, the velocity at which the positive ions collide against the diamond coating surface is reduced to be too small to satisfactorily smooth the diamond coating surface. If the negative bias voltage value is larger than 1500 V, on the other hand, the diamond coating surface is bombarded with the positive ions at excessively high velocity, namely, the velocity at which the positive ions collide against the diamond coating surface is increased to be so large that the diamond coating is likely to be easily removed from the substrate.

The diamond-coated body defined in each of the ninth and twelfth aspects of the invention may be a rotary cutting tool such as an end mil, a drill, a tap and a threading die each of which is to be rotated about its axis relative to a workpiece; a non-rotary cutting tool such as a replaceable insert which is fixed to a tool holder used for a lathe cutting operation; a cold-forming tool which is designed to form a workpiece into a desired shape by plastically deforming the workpiece; and any other machining tools each of which is to be moved relative to a workpiece for thereby machining the workpiece. In addition, the diamond-coated body of the invention may be other than such machining tools. The cutting tool provided by the diamond-coated body of the invention is advantageously used to cut, particularly, an aluminum casting, an aluminum alloy, a copper, a copper alloy or other non-ferrous metal, although the cutting tool may be used to cut a material other than the non-ferrous metal.

Since the negative bias voltage is applied to the diamond-coated body in the manufacturing or smoothing method of the invention, the substrate of the diamond-coated body defined in each of the ninth and twelfth aspects of the invention is preferably made of a cemented carbide or other material having a certain degree of conductivity. Similarly, the diamond-coated body defined in each of the first and fifth aspects of the invention is formed by applying the diamond coating onto a substrate which is preferably made of a cemented carbide or other material having a certain degree of conductivity.

The coating forming step, in which the substrate is covered at its surface with the diamond coating, is implemented by using preferably a CVD method such as a microwave plasma CVD method and a hot filament CVD method. However, the coating forming step may be implemented by using the other method such as an ion-beam method.

BRIEF DESCRIPTION OF THE DRAWINGS

The above and other objects, features, advantages and technical and industrial significance of this invention will be better understood by reading the following detailed description of the presently preferred embodiment of the invention, when considered in connection with the accompanying drawings, in which:

FIG. 4 is a table showing measured surface roughness of four end, mills of Samples 1–4, wherein each of, Samples 2–4 was subjected to a surface smoothing treatment according to a method of the invention while Sample 1 was not subjected to a surface smoothing treatment;

FIG. 6 is a table showing measured surface roughness of a workpiece which was machined by Samples 1–4 of FIG. 4.

DETAILED DESCRIPTION OF THE PREFERRED EMBODIMENT

Figure 1:
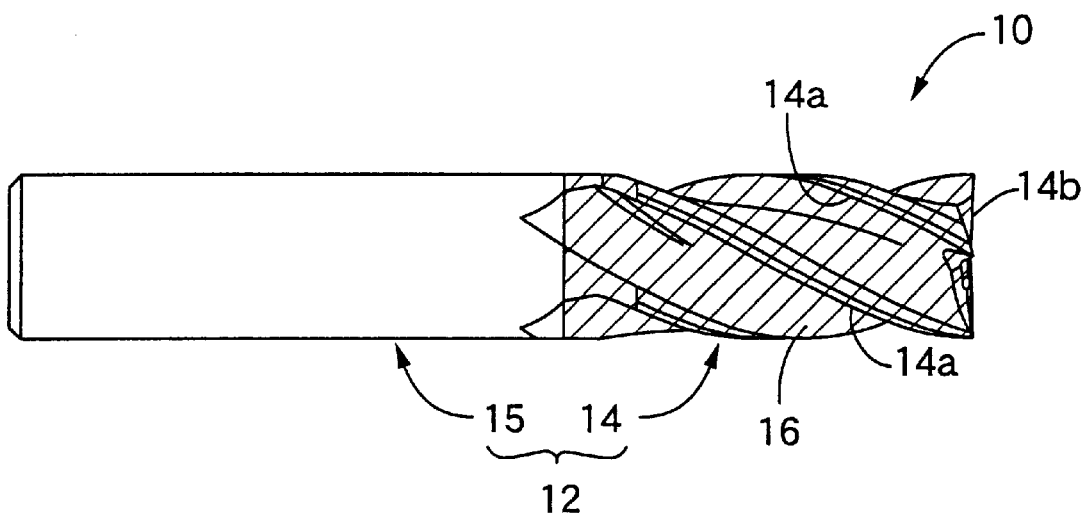
FIG. 1 is an elevational view of a diamond-coated body in the form of an end mill which is manufactured according to a method of the present invention.

FIG. 1 shows a diamond-coated body in the form of an end mill 10 which is constructed according to this invention. The end mill 10 includes a tool substrate (base material) 12 made of a cemented carbide and having a generally cylindrical shape. The tool substrate 12 has a cutting teeth portion 14 and a shank portion 15 which are formed integrally with each other. The cutting teeth portion 14, in which helical flutes and cutting teeth are formed, has a surface that is coated with a diamond coating 16. In FIG. 1, the oblique-lined portion represents a portion of the surface on which the diamond coating 16 is coated. Each of the cutting teeth has a peripheral flank face, a bottom or end flank face and a rake face which is provided by the corresponding one of the helical flutes, so that a peripheral cutting edge 14a and a bottom or end cutting edge 14b are formed in each cutting tooth. The peripheral cutting edge 14a is defined by an intersection of the rake face and the peripheral flank face, while the end cutting edge 14b is defined by an intersection of the rake face and the end flank face. The helical flutes extend in a helical direction of the tool substrate 12. The peripheral cutting edge 14a of each cutting tooth does not lie on a single plane, but lies on a three-dimensional surface and extends in the helical direction.

Figure 2:
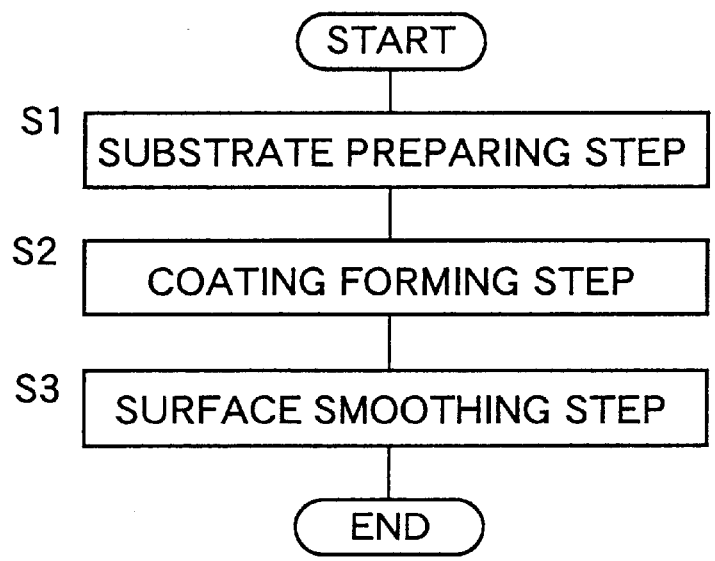
FIG. 2 is a flow chart illustrating a procedure for manufacturing the end mill of FIG. 1.

FIG. 2 is a flow chart illustrating a procedure for manufacturing the end mill 10 of FIG. 1. The manufacturing procedure is initiated with a substrate preparing step S1 in which a cemented carbide bar is subjected to a grinding operation and/or other machining operation for forming the tool substrate 12. A coating forming step S2 is then implemented to form the diamond coating 16 on the surface of the cutting teeth portion 14 of the tool substrate 12 by using a microwave plasma CVD device or other suitable device. For the purpose of increasing an adhesion strength with which the diamond coating 16 adheres to the tool substrate 12, it is preferable to roughen the surface of the cutting teeth portion 14 of the tool substrate 12 by chemical corrosion treatment, for example, before the implementation of the coating forming step S2.

Figure 3A:
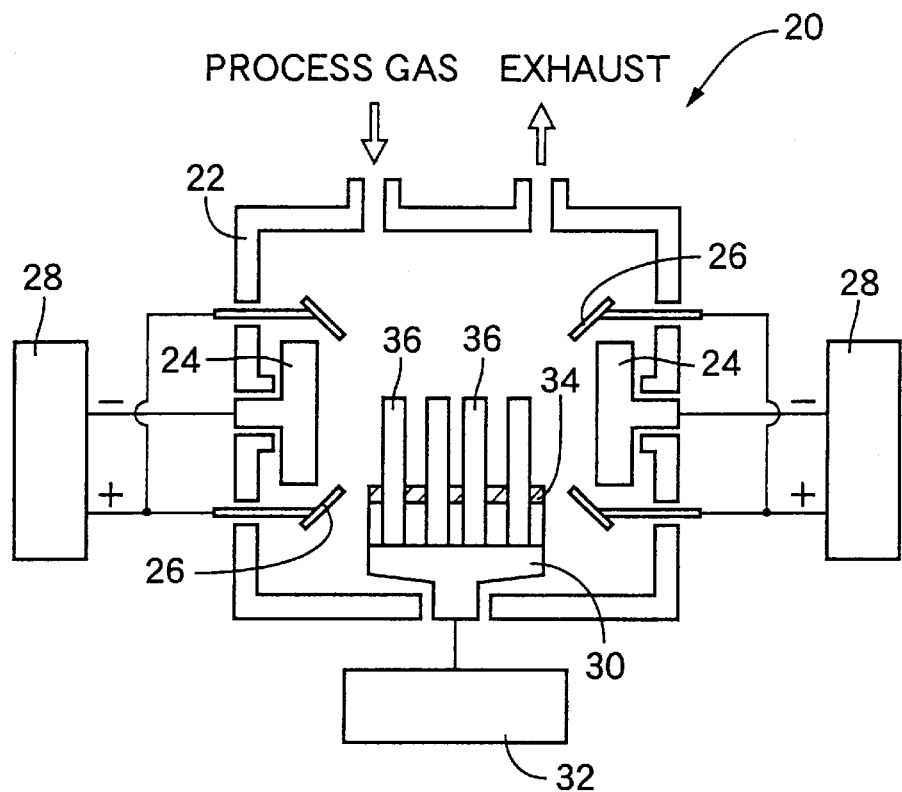
FIG. 3A is a view schematically illustrating an arc-type ion plating device which is used in a surface smoothing step S3 of FIG. 2.

The coating forming step S2 is followed by a surface smoothing step S3 in which the surface of the diamond coating 16 is subjected to a surface smoothing treatment (a bombard treatment). The surface smoothing step S3 is implemented by using an arc-type ion plating device 20 which is illustrated in FIG. 3A. The arc-type ion plating device 20 includes a chamber 22 which is connected to a vacuum pump (not shown); a plurality of metallic targets 24 and anodes 26; and an arc-discharge power source 28 connected to the metallic targets 24 and the anodes 26, for causing arc discharge between the targets 24 and the anodes 26. The ion plating device 20 further includes a rotary table 30, a bias-voltage power source 32 and a supporting member 34 which is disposed on the rotary table 30. A plurality of intermediate products 36 are supported by the supporting member 34 such that the cutting teeth portion 14 of each intermediate product 36, which has been coated with the diamond coating 16 in the coating forming step S2, is positioned upwardly of the shank portion 15. The bias-voltage power source 32 is provided to apply a negative bias voltage to the intermediate products 36 via the rotary table 30. It is noted that, before the implementation of the surface smoothing step S3, the intermediate products 36 are degreased or cleaned by an ultrasonic cleaning in which alcohol, alkaline cleanser or other solvents is used. It is also noted that a process gas introduced into the chamber 22 may be, for example, argon (Ar) gas, nitrogen ($N_2$) gas, acetylene ($C_2H_2$) gas, or methane ($CH_4$) gas.

Figure 3B:
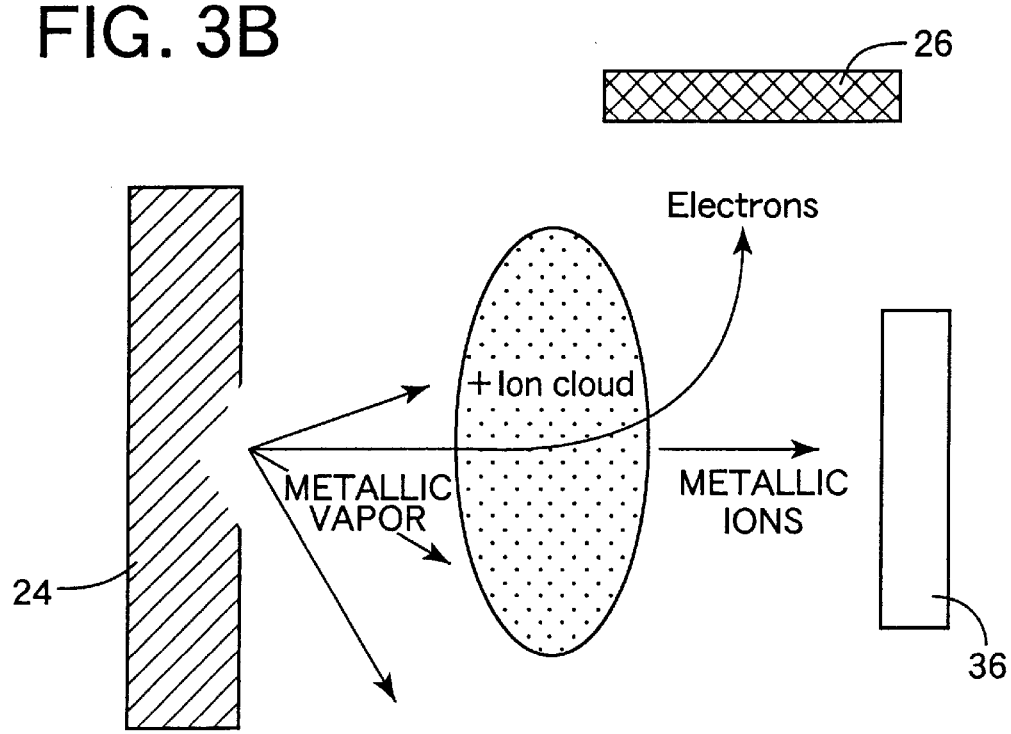
FIG. 3B is a view illustrating an operation of the arc-type ion plating device of FIG. 3A.

FIG. 3B is a view illustrating an operation of the arc-type ion plating device 20 in which the arc discharge is caused between each anode (positive electrode) 26 and the corresponding metallic target 24 which serves as a cathode (negative electrode). The arc discharge is a flow of an electric current between the positive and negative electrodes 26, 24 in a vacuum atmosphere within the chamber 22, causing intense generation of heat and light owing to its high current density. An arc spot having a small size ranging from a few microns to about 10–20 microns is formed on the surface of the metallic target 24, and the formed arc spot is randomly moved on the surface of the metallic target 24. A metallic material forming the metallic target 24 is instantaneously evaporated to become metallic ions (positive ions) which are emitted into the vacuum atmosphere. Meanwhile, a negative bias voltage is applied to the intermediate product 36 which is opposed to the metallic target 24, so that the metallic ions emitted from the metallic target 24 are accelerated in the vicinity of the surface of the intermediate product 36, whereby the surface of the intermediate product 36 is bombarded with the metallic ions which collide with the surface of the intermediate product 36 at a high velocity. The surface of the diamond coating 16 is smoothed by the bombardment of the metallic ions to the surface of the diamond coating 16, whereby the end mill 10 as a final product is obtained.

The metallic material forming the metallic target 24 includes, as its main component, a metal which belongs to one of groups IIIa through IIIb of the periodic table. For example, the material of the metallic target 24 may include, as a major component, one of Ti, TiAl, V, Y, Al and Cr, or may include two or more of these elements in a suitable proportion. The negative bias voltage supplied by the bias-voltage power source 32 has a value of 500–1500 V. It should be understood that the metallic target 24 may be replaced with a non-metallic target including SiC or other non-metallic material which makes it possible to cause the arc discharge in the arc-type ion plating device 20 so that the surface of the diamond coating 16 is smoothed by the arc discharge.

Figure 5A:
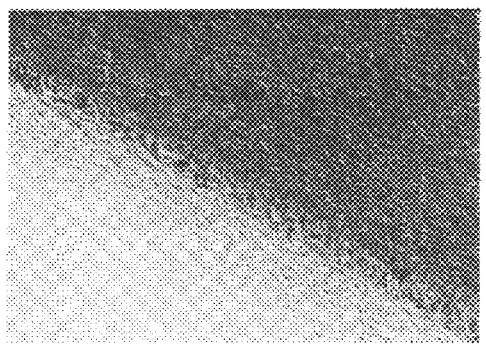
FIG. 5A is a microphotograph showing a cutting edge of Sample 2 of FIG. 4 before and after the surface smoothing treatment, and taken by an electron microscope with magnification of ×350.
Figure 5A:
Figure 5A:
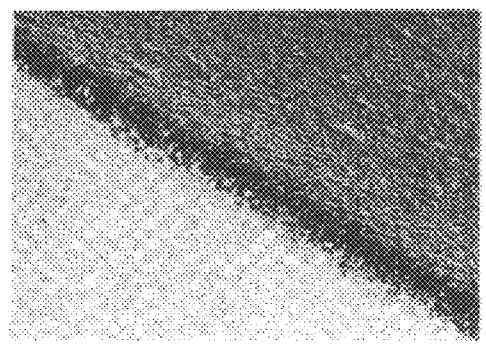
Figure 5B:
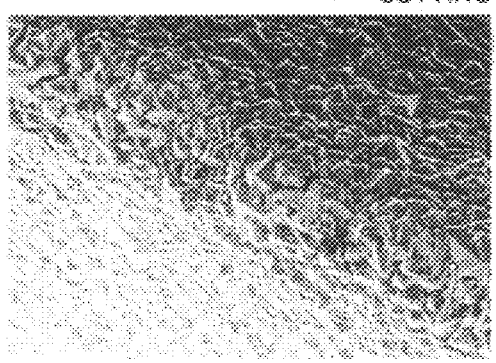
FIG. 5B is a microphotograph showing the cutting edge of Sample 2 of FIG. 4 before and after the surface smoothing treatment, and taken by an electron microscope with magnification of ×1000.
Figure 5B:
Figure 5B:
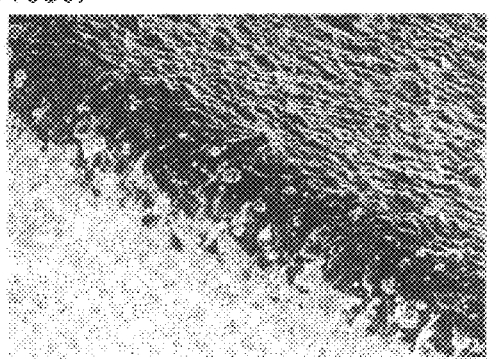
Figure 5C:
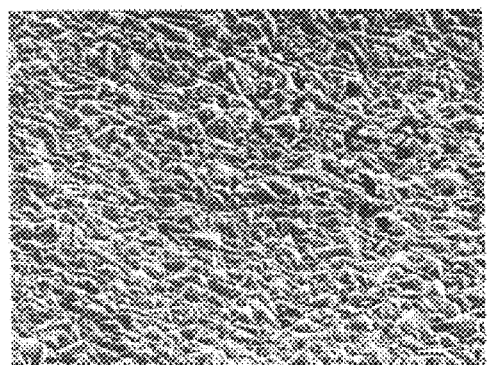
FIG. 5C is a microphotograph showing a peripheral flank face of Sample 2 of FIG. 4 before and after the surface smoothing treatment, and taken by an electron microscope with magnification of ×1000.
Figure 5C:
Figure 5C:
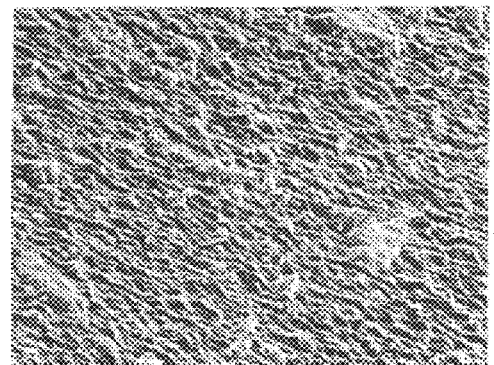

FIG. 4 is a table showing measured surface roughness of four end mills consisting of Samples 1–4. Sample 1 was prepared without the surface smoothing treatment, namely, without implementation of the surface smoothing step S3 of FIG. 2. Sample 2 was subjected to the surface smoothing treatment in which Ti was used as the material of the metallic target 24. Sample 3 was subjected to the surface smoothing treatment in which TiAl was used as the material of the metallic target 24. Sample 4 was subjected to the surface smoothing treatment in which Cr was used as the material of the metallic target 24. In the measurements, the surface roughness of the diamond coating in the peripheral flank face, the end flank face and the rake face of each Sample was measured. Each surface roughness value in the table of FIG. 4 represents a maximum height Ry of the measured surface roughness. FIGS. 5A, 5B and 5C are microphotographs taken by an electron microscope, showing the cutting edge (×350, ×1000) and the peripheral flank face (×1000) of Sample 2 before and after the surface smoothing treatment in which Ti was used as the material of the metallic target 24.

In the surface smoothing treatment implemented for Samples 2–4, the pressure within the chamber 22 was reduced to about $1.33 \times 8.5 \times 10^6$ Pa (pascals), while the temperature within the chamber 22 was raised by preheating with a heating device at 500° C. for 40 minutes. After the pressure reduction and the preheating for the predetermined time, the arc discharge was caused between the metallic target 24 and the anode 26 while the negative bias voltage was held in 1000 V for 120 minutes. The temperature within the chamber 22 was then cooled for 90 minutes such that the temperature was gradually lowered. After the cooling, a nitrogen gas was introduced into the chamber 22. Fifteen minutes after the introduction of the nitrogen gas, the Sample was taken out of the chamber 22.

As shown in the table of FIG. 4, the maximum height Ry in the peripheral flank face of Sample 1 which was not subjected to a surface smoothing treatment was about 3.3 μm, while the maximum height Ry in the peripheral flank face of Samples 2–4 which were subjected to the surface smoothing treatment according to the method of the invention was not larger than 2.0 μm. That is, owing to the surface smoothing treatment, the maximum height Ry was reduced by about 40%, namely, the surface smoothness of the diamond coating 16 was remarkably improved.

A cutting test was conducted by using the above-described Samples 1–4. FIG. 6 is a table showing measured surface roughness of workpiece which was machined or cut by each of Samples 1–4. In the test, the workpiece was cut at its side faces by the peripheral cutting edges of each of Samples 1–4 under a cutting condition as specified below. It is noted that each of Sample 1–4 was an end mill having four helical flutes or teeth, as shown in FIG. 1, and having an outside diameter of 14.5 mm.

Cutting Condition
 Workpiece: A7075 (Aluminum)
 Used milling machine: Horizontal type machining center
 Cutting fluid: Water soluble cutting fluid
 Cutting velocity: 20000 $min^{-1}$
 Feed rate: 2400 mm/min
 Depth of cut: AD (Axial depth)=20 mm
  RD (Radial depth) =0.1 mm As is apparent from the table of FIG. 6, Samples 2–4, to which the principle of the invention was applied, provided the workpiece with higher degree of surface smoothness than Sample 1 which was not subjected to the surface smoothing treatment. It is noted that the symbol "Rmax" shown in the table of FIG. 6 represents a maximum height Rmax which is defined in JIS-B0601 (1982). The maximum height Rmax is obtained by (a) sampling a section having a predetermined length, out of a profile curve which represents a profile of the measured surface and which lies on a plane perpendicular to the measure surface; (b) obtaining two straight lines which is parallel to an average line in the sampled section of the profile curve and which respectively pass the crest and root in the sampled section; and (c) measuring a distance between the two straight lines in a transversal magnification direction that is perpendicular to a direction of the above-described predetermined length of the sampled section. The measured distance is represented, as the maximum height Rmax, in the unit of micrometers ($\mu$m).

As described above, the end mill 10 in the present embodiment is produced according to the method which includes the substrate preparing step S1, the coating forming step S2 and the surface smoothing step S3. The coating forming step S2 is implemented by using the microwave plasma CVD device or other suitable device, for forming the diamond coating 16 on the surface of the cutting teeth portion 14 of the tool substrate 12. The surface smoothing step S3 is then implemented by using the arc-type ion plating device 20, for causing the arc discharge between the metallic target 24 and the anode 26 so as to emit the metallic ions from the metallic target 24, and for applying the negative bias voltage to the intermediate product 36, whereby the surface of the diamond coating 16 of the intermediate product 36 is bombarded with the positive ions or metallic ions which collide with the surface of the diamond coating 16 at a high velocity. The surface of the diamond coating 16 is smoothed by the bombardment of the metallic ions to the surface. The present method makes it possible to provide the diamond coating with a high degree of surface smoothness, while maintaining an accuracy of the complicated three-dimensional geometry of the peripheral and end cutting edges 14a, 14b, thereby enabling the end mill 10 to cut or machine a workpiece with high degrees of surface smoothness and profile accuracy.

In addition, it is possible to smooth the surfaces of the diamond coatings 16 of a larger number of intermediate products 36 in a short time owing to the use of the arc-type ion plating device 20, leading to an improved production efficiency of the end mill 10 having a high degree of surface smoothness of the diamond coating 16. An experiment conducted by the present inventors revealed that the maximum number of the intermediate products 36 which can be subjected to the surface treatment simultaneously with each other was 840 where the shank portion 15 has a diameter of 6 mm, and was 520 where the shank portion 15 has a diameter of 10 mm. That is, it was possible to smooth the surfaces of the diamond coatings 16 of such a large number of the intermediate products 36 at one time, which were disposed in the chamber 22. In either of the two cases, i.e., the case where the 840 intermediate products 36 each having the shank diameter of 6 mm were subjected to the surface smoothing treatment and the case where the 520 intermediate products 36 each having the shank diameter of 10 mm were subjected to the surface smoothing treatment, a time required for predetermined surface smoothness of the diamond coating 16 of each product was about 280 minutes. Namely, the arc discharge between the metallic target 24 and the anode 26, and the application of the negative bias voltage 1000V to the intermediate products 36 were maintained for about 280 minutes.

While the presently preferred embodiment of the present invention has been illustrated above, it is to be understood that the invention is not limited to the details of the illustrated embodiment, but may be embodied with various other changes, modifications and improvements, which may occur to those skilled in the art, without departing from the spirit and scope of the invention defined in the following claims.

What is claimed is:

1. A method of smoothing a surface of a diamond coating of a diamond-coated body, by using an arc ion plating device in which at least one target is dispose; said method comprising:

a step of causing arc discharge between an anode, and a cathode which is provided by each of said at least one target, whereby positive ions are emitted from said at least one target; and a step of applying a negative bias voltage to said diamond-coated body which is disposed in said arc ion plating device, whereby said surface of, said diamond coating is bombarded with said positive ions, so as to be smoothed by the bombardment of said positive ions against said surface of said diamond coating.

2. A method according to claim 1, wherein each of said at least one target includes, as a main component thereof, an element which belongs to one of groups IIIa through IVb of the periodic table.

3. A method according to claim 2, wherein each of said at least one target includes at least one of Ti, TiAl, SiC, VI Y, Al and Cr.

4. A method according to claim 1, wherein said negative bias voltage has a value of 500–1500 V.

5. A method of smoothing a surface of a diamond coating of a diamond-coated body, by using an arc ion plating device in which at least one metallic target is disposed, said method comprising:

a step of causing arc discharge between an anode, and a cathode which is provided by each of said at least one metallic target, whereby metallic ions are emitted from said at least one metallic target; and.

a step of applying a negative bias voltage to said diamond-coated body which is disposed in said arc ion plating device, whereby said surface of said diamond coating is bombarded with said metallic ions, so as to be smoothed by the bombardment of said metallic ions against said surface of said diamond coating.

6. A method according to claim 5, wherein each of said at least one metallic target includes, as a main component thereof, a metal which belongs to one of groups IIIa through IIIb of the periodic table.

7. A method according to claim 6, wherein each of said at least one metallic target includes at least one of Ti, TiAl, V, Y, Al and Cr.

8. A method according to claim 5, wherein said negative bias voltage has a value of 500–1500 V.

9. A method of manufacturing a diamond-coated body which includes a substrate and a diamond coating disposed on said substrate, said method comprising:

a coating forming step of forming said diamond coating on said substrate; and a surface smoothing step of smoothing a surface of said diamond coating, by using an arc ion plating device in which at least one target is disposed, wherein said surface smoothing step including:

a step of causing arc discharge between an anode, and a cathode which is provided by each of said at least one target, whereby positive ions are emitted from said at least one target; and a step of applying a negative bias voltage to said diamond-coated body which is disposed in said arc ion plating device, whereby said surface of said diamond coating is bombarded with said positive ions, so as to be smoothed by the bombardment of said positive ions against said surface of said diamond coating.

10. A method according to claim 9, wherein said diamond-coated body consists of a machining tool which is to be moved relative to a workpiece, for thereby machining the workpiece.

11. A method according to claim 9, wherein said diamond-coated body consists of a rotary cutting tool which is to be rotated about an axis thereof relative to a workpiece, for thereby cutting the workpiece, and which has a rake face, a flank face and a cutting edge that is defined by an intersection of said rake face and said flank face, and wherein said cutting edge is three-dimensional.

12. A method of manufacturing a diamond-coated body which includes a substrate and a diamond coating disposed on said substrate, said method comprising:

a coating forming step of forming said diamond coating on said substrate; and a surface smoothing step of smoothing a surface of said diamond coating, by using an arc ion plating device in which at least one metallic target is disposed, wherein said surface smoothing step including:

a step of causing arc discharge between an anode, and a cathode which is provided by each of said at least one metallic target, whereby metallic ions are emitted from said at least one metallic target; and.

a step of applying a negative bias voltage to said diamond-coated body which is disposed in said arc ion plating device, whereby said surface of said diamond coating is bombarded with said metallic ions, so as to be smoothed by the bombardment of said metallic ions against said surface of said diamond coating.

13. A method according to claim 12, wherein each of said at least one metallic target includes, as a main component thereof, a metal which belongs to one of groups IIIa through IIIb of the periodic table.

14. A method according to claim 13, wherein each of said at least one metallic target includes at least one of Ti, TiAl, V, Y. Al and Cr.

15. A method according to claim 12, wherein said bias voltage has a value of 500–1500 V.

16. A method according to claim 12, wherein said diamond-coated body consists of a machining tool which is to be moved relative to a workpiece, for thereby machining the workpiece.

17. A method according to claim 12, wherein said diamond-coated body consists of a rotary cutting tool which is to be rotated about an axis thereof relative to a workpiece, for thereby cutting the workpiece, and which has a rake face, a flank face and a cutting edge that is defined by an intersection of said rake face and said flank face, and wherein said cutting edge is three-dimensional.

18. A method according to claim 17, wherein said rotary cutting tool has a flute which provides said rake face and which extends in a helical direction of said rotary cutting tool.

19. A method according to claim 18, wherein said rotary cutting tool consists of an end mill.

* * * * *